United States Patent [19]

Razdan

[11] Patent Number: 5,463,561
[45] Date of Patent: Oct. 31, 1995

[54] HIGH CAPACITY NETLIST COMPARISON

[75] Inventor: Rahul Razdan, Princeton, Mass.

[73] Assignee: Digital Equipment Corporation, Maynard, Mass.

[21] Appl. No.: 85,639

[22] Filed: Jun. 30, 1993

[51] Int. Cl.$^6$ ........................................ G06F 17/50
[52] U.S. Cl. ........................... 364/489; 364/488
[58] Field of Search ........................ 364/488, 489, 364/490, 491

[56] References Cited

U.S. PATENT DOCUMENTS

| | | | |
|---|---|---|---|
| 5,231,589 | 7/1993 | Itoh et al. | 364/490 |
| 5,243,538 | 9/1993 | Okuzawa et al. | 364/489 |
| 5,249,133 | 9/1993 | Batra | 364/489 |
| 5,249,134 | 9/1993 | Oka | 364/491 |
| 5,257,201 | 10/1993 | Berman et al. | 364/489 |

OTHER PUBLICATIONS

Derek L. Beatty et al., "Fast Incremental Circuit Analysis Using Extracted Hierarchy", 25th AMC/IEEE Design Automation Conference, Paper 33.1, pp. 495–500.
D. G. Corneil et al., "A Theoretical Analysis of Various Heuristics for the Graph Isomorphism Problem" SIAM J. Comput., vol. 9, No. 2, May 1980.
D. G. Corneil, "Recent Results on the Graph Isomorphism Problem", Proc. Eighth Manitoba Conference on Numerical Math. and Computing, 1978, pp. 13–31.
Ronald C. Read et al., "The Graph Isomorphism Disease", Journal of Graph Theory, vol. 1 (1977) 339–363.
K. L. Kodandapani et al., "A Wireless Compare Program for Verifying VLSI Layouts", IEEE Design & Test, Jun. 1986, pp. 46–51.
Pradeep Batra et al., "Hcompare: A Hierarchical Netlist Comparison Program", 29th ACM/IEEE Design Automation Conference, Paper 21.1, pp. 299–304.
Carl Ebeling et al., "Validating VLSI Circuit Layout By Wirelist Comparison", Computer Science Department Carnegie–Mellon University, pp. 172–1731.

*Primary Examiner*—Vincent N. Trans
*Attorney, Agent, or Firm*—Fish & Richardson

[57] ABSTRACT

A method for determining whether multiple representations of a design of a circuit are consistent with each other, where the circuit includes multiple devices with channels for conducting electrical current. Each representations includes a list of device elements that describe the devices and node elements that describe the nodes which interconnect the devices. The method includes modifying each of the lists by: (1) analyzing the device elements and the node elements to identify at least one channel connected region of said circuit (where a channel connected region includes the subset of the devices that have channels interconnected by a subset of the nodes), (2) defining, for each channel connected region, a channel connected region element that describes the subset of the devices and the subset of the nodes in the region, and (3) replacing the device elements of each subset of devices and the node elements of each subset of nodes in the lists with the channel connected region elements. Thereafter, the modified lists are compared as a basis for determining whether the representations are consistent with each other.

17 Claims, 9 Drawing Sheets

```
150                                    152
  \                                   /
   CCR_GENERATE(CCR_TYPE CCR,
                NODE_TYPE N)
                            \ 154
    {
    156)  if (N is a power or ground node) return;
    158)  if (N is in CCR.NODES queue) return;
    160)  add_to_queue(CCR.NODES,N);
    162)  For all transistors with source/drain
             connections to node N (let T be iterator
             {
    164)     if (T is not in CCR.TRANS queue)
                 add_to_queue(CCR.TRANS,T);

166)     CCR_GENERATE(CCR,T.source);
    168)     CCR_GENERATE(CCR,T.drain);
             }
    }
```

FIG. 5

HIGH CAPACITY NETLIST COMPARISON

BACKGROUND OF THE INVENTION

The invention relates to verifying that different representations of a design of a circuit are consistent with each other.

VLSI design involves the transformation of a design specification into a layout that can be fabricated as an integrated circuit on a chip. During the design process, designers synthesize abstractions of the specification with increasing detail until the layout is generated. The most detailed of the non-layout abstractions is the transistor level schematic.

A major task of the design process is verification that the various abstractions are consistent with the specification and with each other. For example, designers verify that the transistor level schematic and the layout are consistent by comparing representations of these abstractions.

SUMMARY OF THE INVENTION

One general aspect of this invention is a method of determining the consistency between multiple representations of a design of a circuit by using channel connected regions to simplify comparison of representations of a circuit that includes a plurality of devices interconnected by a plurality of nodes, with each device having a channel for conducting electrical current. Each representation includes a list of device elements that describe the devices and node elements that describe the nodes. The method includes modifying a first list (representing, e.g., a schematic diagram of the circuit), modifying a second list (representing, e.g., a physical layout of the circuit), and comparing the results of these modifications as a basis for determining whether the representations that include the lists are consistent with each other.

Each list is modified in the following manner. First, the device elements and the node elements are analyzed to identify channel connected regions of the circuit. Each channel connected region includes a subset of the devices that share a common channel and are interconnected by a subset of the nodes. Next, a channel connected region element that describes the subset of devices and the subset of nodes in a channel connected region is defined for each channel connected region. Finally, the device elements and the node elements of the nodes and devices of a channel connected region are replaced in the list with the channel connected region element.

Because the lists are modified by replacing subsets of device elements and node elements with channel connected region elements, the modified lists for comparison are substantially smaller than the lists prior to modification. As a result, comparison of representations of a given circuit is less complex when using the modified lists of the invention than when using the original lists. Therefore, a computer performing the comparison needs less memory and processing capacity when implementing the invention than is needed when implementing a comparison of the original lists. Viewed another way, a computer having a given capacity can compare representations of more complex circuits when implementing the invention than when comparing the original lists.

The invention offers another advantage in that, because the modification of the lists uses the natural hierarchy of the circuit, the invention does not require a user to supply hierarchical information.

Preferred embodiments of the invention include the following features.

The lists are modified by repeating the steps of analyzing, defining, and replacing at least until every one of the devices and the nodes has been analyzed.

The modification includes determining whether the devices in the subset are distinguishable from each other and whether the nodes in the subset are distinguishable from each other. The devices and nodes in the subsets that are distinguishable from each other are described in the channel connected region element, and the corresponding device elements and node elements are removed from the list. The device elements that are determined to be not distinguishable from each other and the node elements that are determined to be not distinguishable from each other are retained in the list. Also retained in the list are the node elements that interconnect the channel connected regions to each other or to another one of the devices of the circuit.

Each one of the node elements is preassigned a value that corresponds to at least one electrical characteristic (i.e., capacitance) of the node described thereby. Each one of the device elements is preassigned a value that corresponds to at least one electrical characteristic (i.e., device size and conductive type) of the device described thereby. The values for the node elements in the subsets are compared to determine whether the nodes are distinguishable from each other.

For nodes that are determined to be not distinguishable from each other, the values of the node elements that describe those nodes are revised based on the values of the device elements that describe the devices connected to those nodes. Thereafter, the revised values of the nodes are compared to determine whether the nodes are distinguishable from each other.

If the nodes are determined to be distinguishable from each other, the nodes and devices in the channel connected region are described in the channel connected region element and the device elements that describe those devices and the node elements that describe those nodes are removed from the list.

For devices that are determined to be not distinguishable from each other, the values of the device elements that describe those devices are revised based on the values of the node elements that describe the nodes connected to those devices. Thereafter, the revised values of the devices are compared to determine whether the devices are distinguishable from each other. If not, the revising and comparing steps are repeated until either all of the devices have been determined to be distinguishable from each other or the values of all of the device elements have been revised.

If, after the values of all of the device elements have been revised, at least some of the devices that have been determined to be not distinguishable from each other have channels that are connected in parallel, those devices and the nodes to which those devices are connected are described in the channel connected region element, and the device elements that describe those devices and the node elements that describe those nodes are removed from the list.

When the circuit includes nodes and devices arranged to define inverters, the node elements and device elements that represent the nodes and devices arranged to define inverters are removed from the first list and the node elements and device elements that represent the nodes and devices connected to the inverters are modified to account for the electrical and logical effects of the inverters. This is done prior to modifying the first list based on channel connected regions.

To compare the modified first and second lists, each of the node elements and channel connected region elements contained therein is assigned a value that corresponds to at least one characteristic of the node or device described thereby. All channel connected region elements that are distinguishable (i.e., the channel connected region elements that appear only once in each of the first and second lists) are then selected. Thereafter, the values of the node elements representing the nodes connected to the channel connected regions represented by the selected channel connected region elements are compared to determine whether those nodes are distinguishable from each other. For nodes that are determined to be indistinguishable from each other, the values of the corresponding node elements are revised based on the values of the channel connected region elements that describe the channel connected regions connected to those nodes. These revised values are then compared to determine whether the nodes are distinguishable from each other and, if the nodes are determined to be distinguishable from each other, the values of the node elements from the first list are compared to the values of the node elements from the second list as a basis for determining whether the representations are consistent with each other.

The values of the channel connected region elements are also compared to determine whether the channel connected region elements are distinguishable from each other, and the values of the channel connected region elements for channel connected regions that are determined to be indistinguishable from each other are revised based on the values of the node elements that describe the nodes connected to the channel connected regions. Thereafter, the revised values are compared to determine whether the channel connected regions are distinguishable from each other. If the channel connected regions are determined to be distinguishable from each other, the values of the channel connected region elements from the first list are compared to the values of the channel connected region elements from the second list as a basis for determining whether the representations are consistent with each other.

The values of the node elements representing the nodes connected to channel connected regions represented by channel connected region elements the values of which were previously revised are then compared to determine whether those nodes are distinguishable from each other. For nodes that are determined to be indistinguishable from each other, the values of the node elements that describe those nodes are revised based on the values of the channel connected region elements that describe the channel connected regions connected to those nodes. Thereafter, the revised values of the node elements are compared to determine whether the nodes are distinguishable from each other. If the nodes are determined to be distinguishable from each other, the values of the node elements from the first list are compared to the values of the node elements from the second list as a basis for determining whether the representations are consistent with each other.

Other features and advantages of the invention will become apparent from the following detailed description, and from the claims.

BRIEF DESCRIPTION OF THE DRAWING

FIG. 5 is pseudocode of a procedure used to identify CCRs by the system of FIG. 2.

DESCRIPTION OF THE PREFERRED EMBODIMENTS

Figure 1:
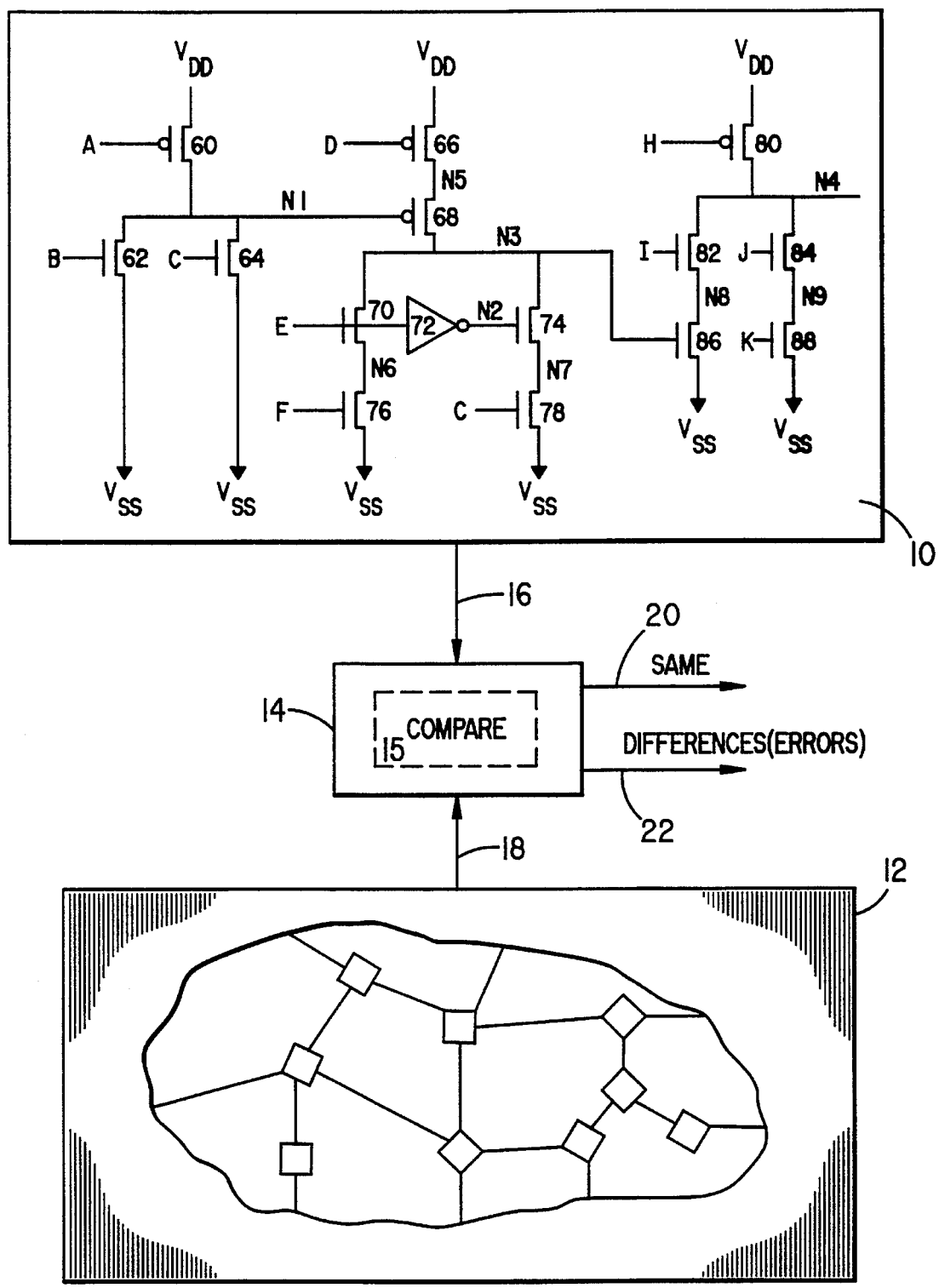
FIG. 1 is a block diagram of a system for comparing a transistor level schematic and a layout.

Referring to FIG. 1, designers use a processor 14 running a netlist-compare program 15 to verify the consistency of a transistor level schematic 10 and a layout 12. Netlist-compare program 15 accepts a description 16 of transistor level schematic 10 and a description 18 of layout 12 as inputs and compares these inputs. If, as a result of the comparison, netlist-compare program 15 determines that transistor level schematic 10 and layout 12 are consistent, netlist-compare program 15 produces a signal 20 indicating the consistency. If netlist-compare program 15 determines that transistor level schematic 10 and layout 12 are inconsistent, netlist-compare program 15 produces an error list 22 that indicates the differences between transistor level schematic 10 and layout 12.

Advances in technology have enabled designers to design integrated circuits of increasing complexity. As integrated circuits have become more complex, the number of elements described in transistor level schematic 10 and layout 12 has increased accordingly.

Figure 2:
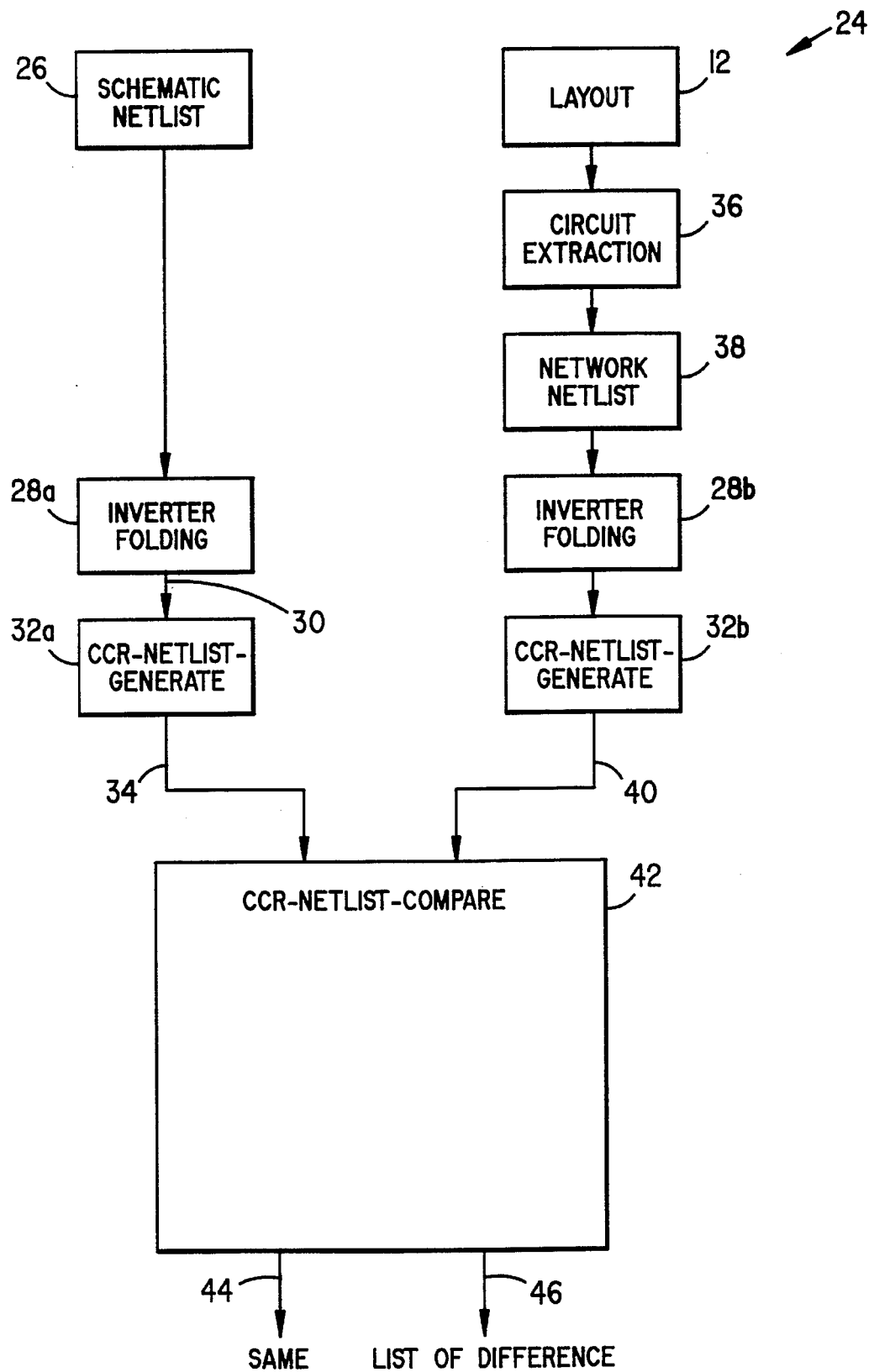
FIG. 2 is a block diagram of a system for comparing a transistor level schematic and a layout according to the invention.

Referring to FIG. 2, according to the invention, processor 14 runs a high capacity netlist-compare ("HCNC") program 24 that uses serial preprocessing to reduce the size of the input files 34, 40 used relative to the size of the input files 16, 18 used by a typical netlist-compare program 15. HCNC program 24 also includes a Channel-Connected-Region-netlist-compare procedure 42 that compares reduced size input files 34, 40. The reduction in the size of input files 34, 40 means that, for a given transistor level schematic 10 (and corresponding layout 12), processor 14 needs less memory and processing capacity when implementing HCNC program 24 than is needed when implementing a typical netlist-compare program 15. This, in turn, means that, when processor 14 has a given capacity, processor 14 can compare larger transistor level schematics 10 and layouts 12 when implementing HCNC program 24 than when implementing a typical netlist-compare program 15.

A processor 14 implementing HCNC program 24 preprocesses transistor level schematic 10 as follows. In practice, transistor level schematic 10 is stored as a list of nodes and devices known as a schematic netlist 26. Processor 14 produces a folded schematic netlist 30 from schematic netlist 26 through an inverter folding procedure 28. The significance of inverter folding 28 is discussed below. Next, processor 14 uses folded schematic netlist 30 as input to a CCR-netlist-generation procedure 32a to produce a CCR schematic netlist 34. CCR-netlist-generation procedure 32 is based on Channel Connected Regions ("CCRs"), which uniquely identify groups of nodes and devices. Because processor 14 replaces groups of nodes and devices from folded schematic with CCRs in CCR schematic netlist 34, CCR schematic netlist 34 is typically substantially smaller than schematic netlist 26. CCR-netlist-generation procedure 32 is discussed in further detail below.

After generating CCR schematic netlist 34, processor 14 generates a network netlist 38 from layout 12 using a process known as circuit extraction 36. Layout 12 is typically stored in a different format than the list of nodes and devices found in schematic netlist 26. Thus, circuit extraction 36 puts layout 12 in a form that is comparable to schematic netlist 26 by converting layout 12 into network netlist 38. Next, processor 14 uses inverter folding 28 and CCR-netlist-generation procedure 32b to produce a CCR network netlist 40. As with CCR schematic netlist 34, CCR network netlist 40 is typically substantially smaller than network netlist 38.

After generating reduced-size CCR schematic netlist 34 and CCR network netlist 40, processor 14 compares CCR netlists 34, 40 using CCR-netlist-compare procedure 42. If, as a result of the comparison, processor 14 determines that netlists 34, 40 are consistent, processor 14 produces a signal 44 which indicates that transistor level schematic 10 and layout 12 are consistent. If processor 14 determines that netlists 34, 40 are inconsistent, processor 14 produces an error list 52 that indicates the differences between transistor level schematic 10 and layout 12.

Having generally described the procedure used by HCNC program 24, aspects of the procedure are now described in more detail.

As discussed above, HCNC program 24 uses CCRs to reduce the size of netlists 34, 40 used as inputs to CCR-Netlist-Compare procedure 42. CCRs include all MOS transistors ("devices") that share a common channel and all nodes that are connected to that channel. The channel is the path between the source terminal and the drain terminal of a device. Thus, a CCR includes all of the devices whose channels are connected by source or drain terminals and the nodes connected to those source or drain terminals. Power nodes ($V_{DD}$), ground nodes (VSS), and gate connections act as CCR termination points.

CCRs provide an ideal structure for consolidating groups of nodes and devices for comparison purposes because, by definition, a particular node or device can only belong to one CCR. Moreover, the CCR to which a particular node or device belongs is dictated by characteristics of the node or device that are constant between consistent netlists. Thus, if a device in a first netlist appears in a particular CCR, and the first netlist is consistent with a second netlist, the same device in the second netlist will appear in a comparable CCR. Also, if the first and second netlists are consistent, a CCR from the first netlist will be identical to a comparable CCR from the second implementation.

Figure 3:
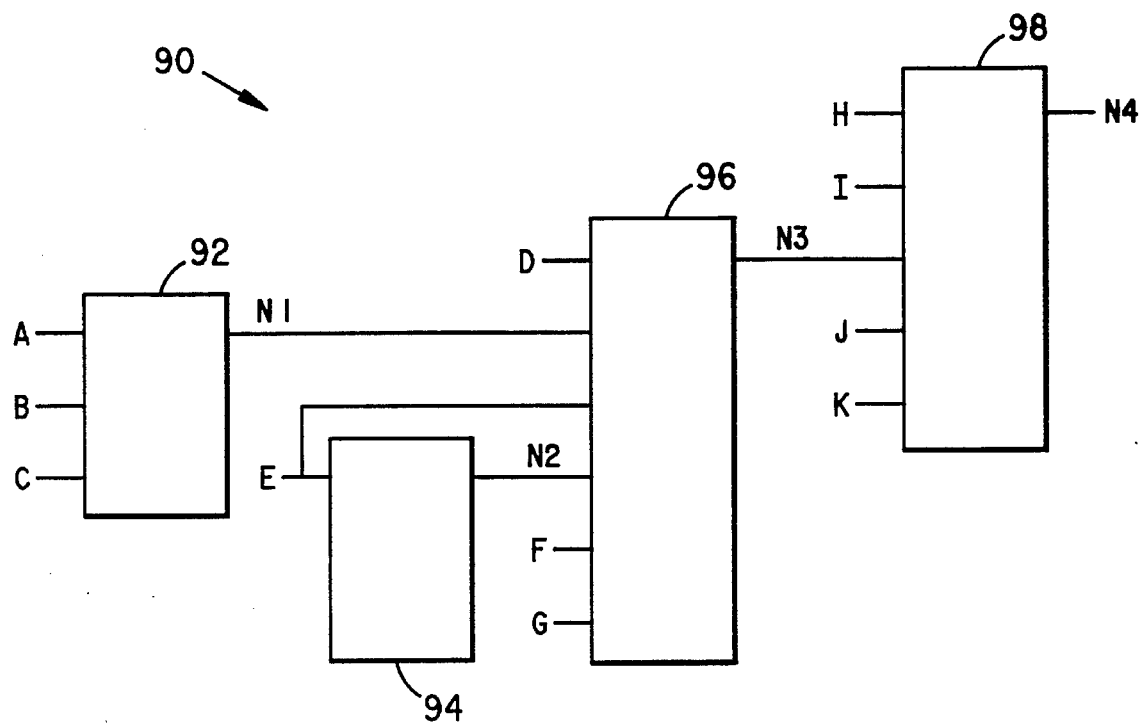
FIG. 3 shows a schematic of a circuit and a schematic of the same circuit after reduction using CCRs.
Figure 3:
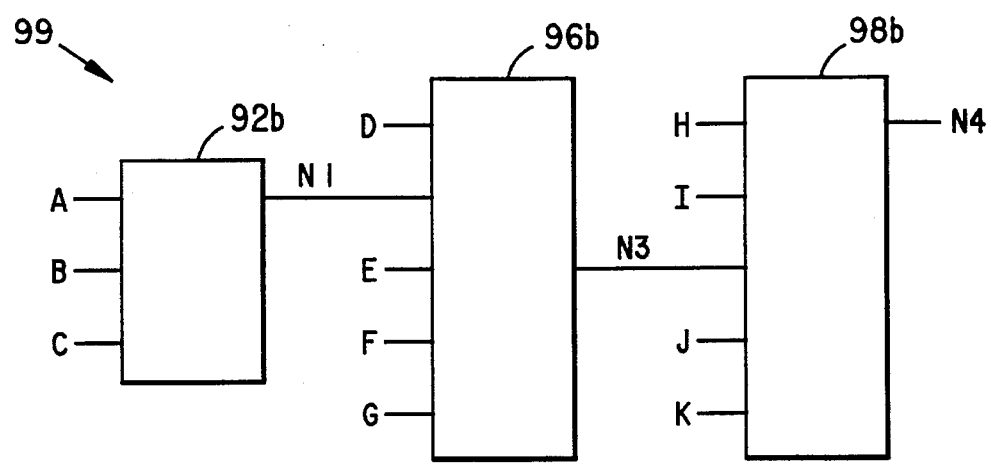

The following example illustrates the definition of a CCR as well as how the use of CCRs by HCNC program 24 substantially reduces the size of CCR netlists 34, 40 relative to netlists 26, 38. Referring to FIGS. 1 and 3, transistor level schematic 10 (FIG. 1) can be converted to a CCR schematic 90 (FIG. 3). While transistor level schematic 10 includes sixteen devices (inverter 72 includes a P-device and a N-device), CCR schematic 90 includes only four CCRs. Moreover, nodes N5, N6, N7, N8, and N9 in transistor level schematic 10 do not appear in CCR schematic 90. Thus, CCR schematic 90 includes substantially fewer elements than transistor level schematic 10.

CCR 92, whose output node is N1, includes devices 60, 62, and 64. Node N1 connects to four devices (60, 62, 64, and 68). CCR 92 includes devices 60, 62, and 64 because each of these devices connects to node N1 via a source/drain terminal. CCR 92 does not include device 68, because device 68 connects to node N1 via the gate terminal of device 68. The source/drain terminals of devices 60, 62, and 64 that are not connected to node N1 are connected to either $V_{DD}$ (device 60) or VSS (devices 62, 64). Because $V_{DD}$ and VSS are the CCR terminators, CCR 92 does not include any additional devices.

CCR 94 includes inverter 72. It should be noted that, in actual operation, processor 14 would eliminate inverter 72 during inverter folding 28 (discussed below). As illustrated by CCR schematic 99, elimination of inventor 72 also eliminates CCR 94. By eliminating CCR 94, node N2 is also eliminated. Moreover, elimination of inverter 72 also reduces by one the number of inputs to CCR 96 (as shown by CCR 96b).

CCR 96 includes devices 66, 68, 70, 74, 76, and 78 and has node N3 as its output node. Devices 68, 70, and 74 belong to CCR 96 because they each connect to node N3 via a source/drain terminal. Devices 66, 76, and 78 belong to CCR 96 because they connect, respectively, to devices 68, 70, and 74 via source/drain terminals. CCR 96 includes no additional devices because the source/drain terminals of devices 66, 76, and 78 that are not connected to devices 68, 70, and 74 are connected to either $V_{DD}$ (device 66) or VSS (devices 76, 78).

Finally, CCR 98 includes devices 80, 82, 84, 86, and 88 and has node N4 as its output node. Devices 80, 82, and 84 belong to CCR 98 because they each connect to node N4 via a source/drain terminal. Devices 86 and 88 belong to CCR 98 because they connect, respectively, to devices 82 and 84 via source/drain terminals. CCR 98 includes no additional devices because the source/drain terminal of device 80 that is not connected to node N4 is connected to $V_{DD}$ and the source/drain terminals of devices 86 and 88 that are not connected to devices 82 and 84 are connected to VSS.

CCR-netlist-generate procedure 32 uses folded schematic netlist 30 as input and produces CCR schematic netlist 34 as output. Folded schematic netlist 30 contains nodes and devices. In optimal circumstances, CCR schematic netlist 34 contains only nodes and CCRs, with the number of nodes in CCR netlist 34 being substantially less than the number of nodes in folded schematic netlist 30 and the number of CCRs in CCR schematic netlist 34 being substantially less than the number of devices in folded schematic netlist 30. However, in most cases, CCR schematic netlist 34 also contains devices.

When CCR schematic netlist 34 contains, these devices belong to non-unique CCRs. A CCR is either unique or non-unique. When a CCR is unique, processor 14 replaces the nodes and devices that comprise the CCR in folded schematic netlist 30 with a CCR signature that completely describes the CCR in CCR schematic netlist 34. When a CCR is non-unique, processor 14 retains the nodes and devices from folded schematic netlist 30 that comprise the CCR in CCR schematic netlist 34. In addition, processor 14 adds to CCR netlist 34 a CCR signature that describes only the number of inputs and the number of outputs of the non-unique CCR. Thus, the reduction in size of CCR schematic netlist 34 relative to folded schematic netlist 30 is directly proportional to the number of unique CCRs in CCR schematic netlist 34. Therefore, the reduction in memory and processing capacity needed by processor 14 is inversely proportional to the number of non-unique CCRs in CCR schematic netlist 34.

A CCR is unique when all of the devices and nodes comprising the CCR are distinguishable from each other. By contrast, a CCR is non-unique when any node or device in the CCR is indistinguishable from another node or device in the CCR. Processor 14 determines whether the nodes and devices in a CCR are distinguishable using a coloring procedure, which is discussed in detail below.

Figure 4:
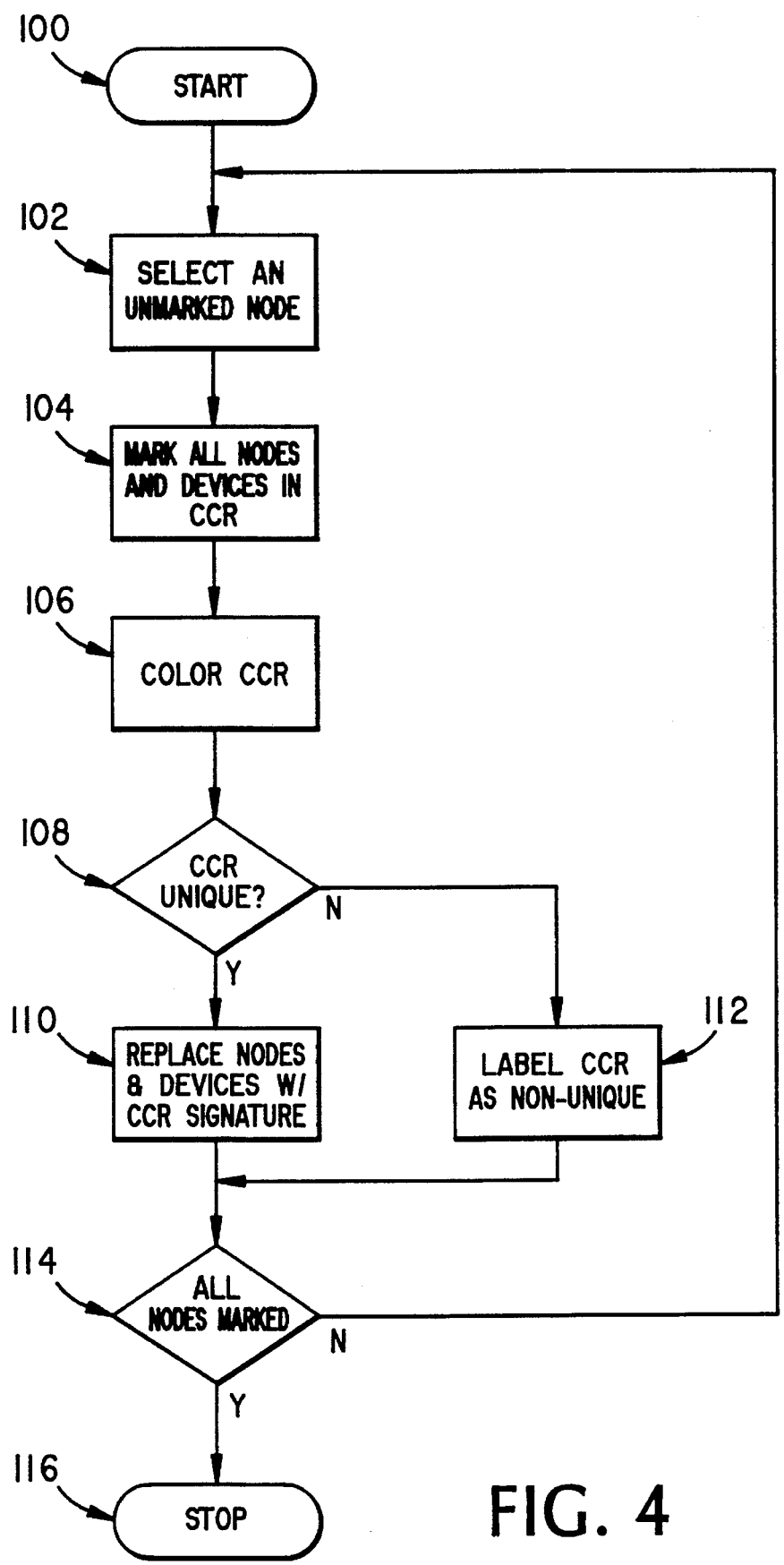
FIG. 4 is a block diagram of a procedure used to generate CCR netlists by the system of FIG. 2.

The steps comprising CCR-netlist-generate procedure 32 implemented by processor 14 are shown in FIG. 4. Processor 14 starts with, for example, folded schematic netlist 30 (step 100). Processor 14 then selects a node from folded schematic netlist 30 (step 102).

Next, processor 14 marks all nodes and devices that are in the CCR in which the selected node is located (step 104). To mark the nodes and devices, processor 14 uses a CCR_GENERATE procedure 150 shown in FIG. 5 and discussed below.

Figure 6:
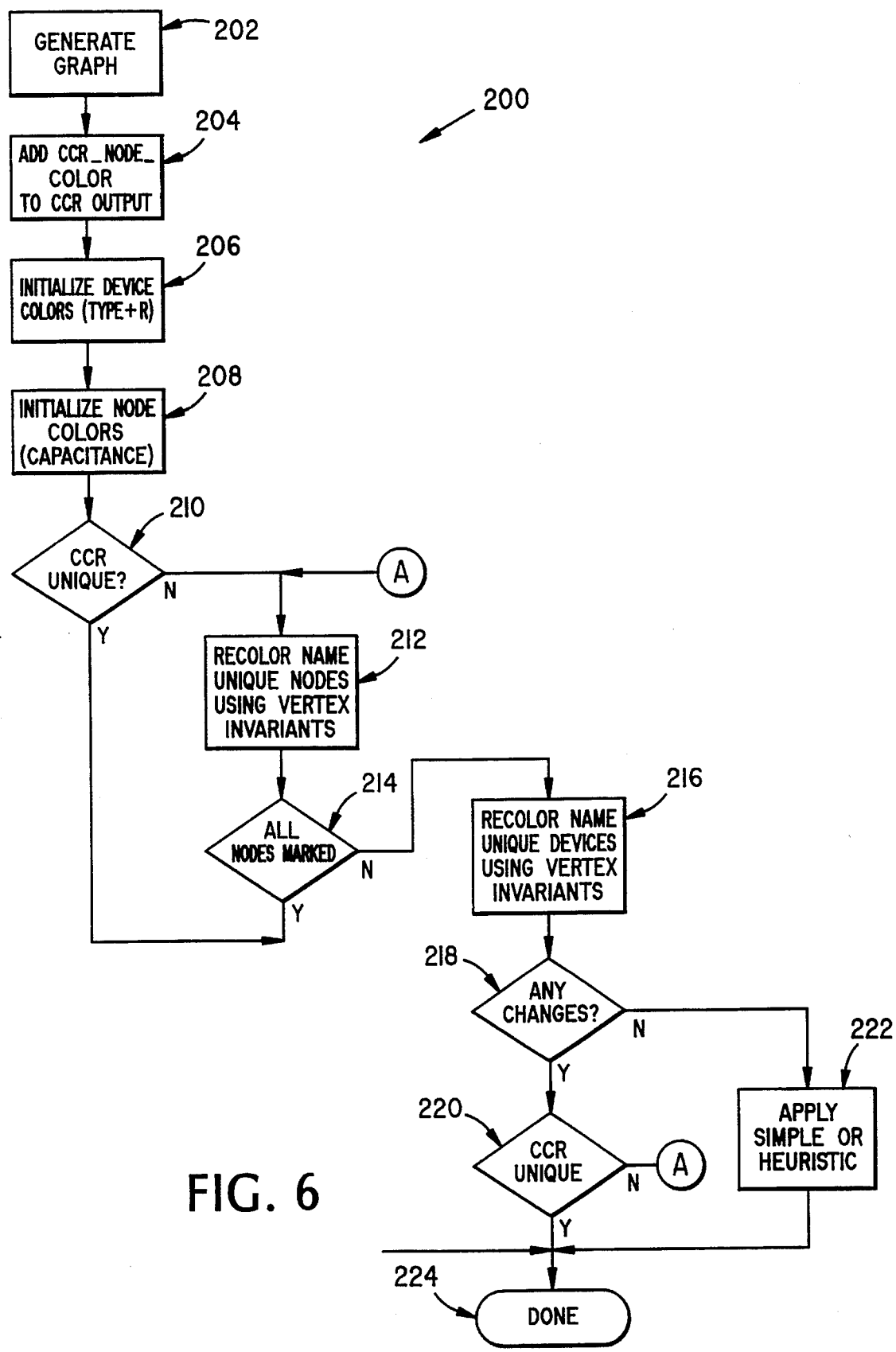
FIG. 6 is a block diagram of a procedure used to color CCRs by the system of FIG. 2.

After marking the nodes and devices in the CCR containing the selected node using CCR_GENERATE procedure 150, processor 14 uses a coloring procedure (step 106) to determine if all of the nodes and devices comprising the marked CCR are distinguishable from each other. If so, the marked CCR is unique. If not, the marked CCR is non-unique. The coloring procedure 200 used by processor 14 is shown in FIG. 6 and discussed below.

If processor 14 determines that CCR 152 is unique (step 108), processor 14 replaces the descriptions of the nodes and the devices comprising CCR 152 in folded schematic netlist 30 with a CCR signature that describes CCR 152 in CCR schematic netlist 34 (step 110). If processor 14 determines that CCR 152 is non-unique (step 108), processor 14 retains the descriptions of the nodes and the devices from CCR schematic netlist 32 that comprise CCR 152 in CCR schematic netlist 34 (step 112). In this case, processor 14 labels the descriptions of the nodes and devices as belonging to CCR 152 and adds a CCR signature that describes the number of input nodes and the number of output nodes of CCR 152.

Next, processor 14 examines folded schematic netlist 30 to determine if all nodes have been marked as associated with a CCR (step 114). If processor 14 determines that no unmarked nodes remain in folded schematic netlist 30, processor 14 terminates the CCR-netlist-generation process (step 116). If processor 14 determines that unmarked nodes remain in folded schematic netlist 30, processor 14 selects an unmarked node (step 102). Processor 14 repeats this procedure until no unmarked nodes remain in folded schematic netlist 30.

Processor 14 uses CCR_GENERATE procedure 150, shown in FIG. 5, to mark all nodes and devices that belong to a particular CCR. CCR_GENERATE procedure 150 is a recursive procedure that, when given the name of a node, marks all nodes and devices belonging to the same CCR as the named node. CCR_GENERATE procedure 150 marks all nodes and devices in a CCR by tracing all paths from a given starting node to power or ground.

When processor 14 calls CCR_GENERATE procedure 150, processor 14 provides sends two parameters: the name of a CCR (denoted by "CCR" in FIG. 5) and the name of a node (denoted by "N" in FIG. 5). As the first step in CCR_GENERATE procedure 150, processor 14 determines if node N is a power or a ground node (step 156). If node N is either of these, processor 14 completes CCR_GENERATE procedure 150 (i.e., returns) without modifying CCR.

If node N is neither a power node nor a ground node, processor 14 determines if node N is already included in the list of nodes comprising CCR (step 158). If so, processor 14 completes CCR_GENERATE procedure 150 without modifying CCR. If not, processor 14 adds node N to the list of nodes comprising CCR (step 160).

Next, processor 14 determines which devices (transistors) have source/drain connections to node N (step 162). For each device (denoted by "T" in FIG. 5) having a source/drain connection to node N, processor 14 determines whether device T is included in the list of devices comprising CCR. If device T is not already included in the list of devices comprising CCR, processor 14 adds device T to the list (step 164). For each device T, processor 14 then makes two further calls of CCR_GENERATE procedure 150. In the first call, processor 14 provides the name of CCR and the name of the node connected to the source terminal of device T (step 166). In the second call, processor 14 provides the name of CCR and the name of the node connected to the drain terminal of device T (step 168).

Figure 7:
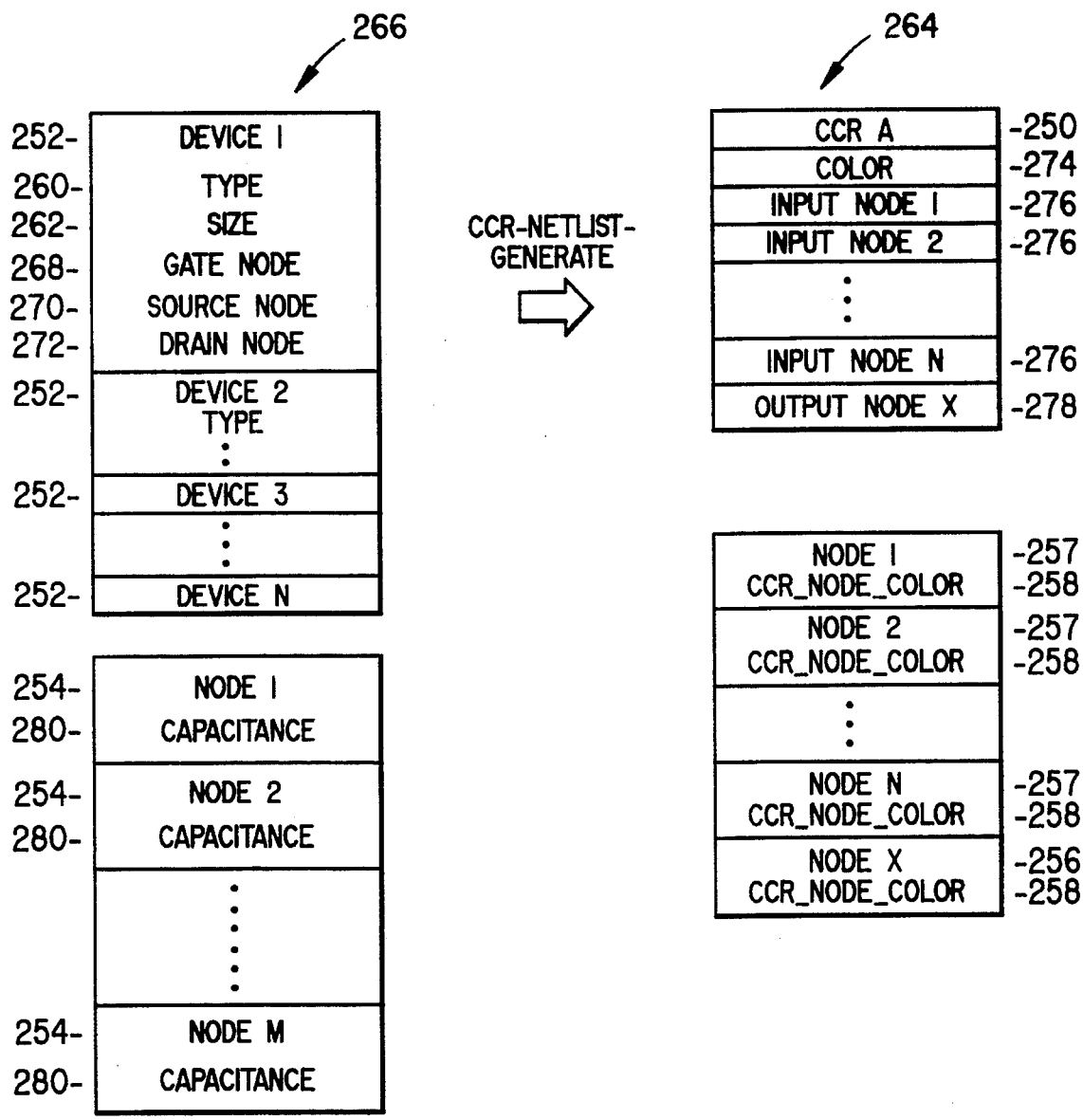
FIG. 7 shows a netlist of a circuit and a netlist of the same circuit after reduction using CCRs by the system of FIG. 2.

Referring also to FIGS. 6 and 7, after marking all nodes and devices in a CCR, processor 14 "colors" the CCR to determine whether the CCR is unique using coloring procedure 200. In this example, processor 14 uses coloring procedure 200 to convert the devices 252 and nodes 254 in list 266 (FIG. 7) to CCR 250, input nodes 257, and output node 256 in list 264.

List 266 contains only the devices that belong to CCR 250 and the internal, input, and output nodes of CCR 250. The internal nodes of a CCR are those nodes that connect only to the source/drain terminals of one or more devices in the CCR. The input nodes of a CCR are those nodes that are connected to the gate terminal of a device in the CCR. The output nodes of a CCR are those nodes that connect to the source/drain terminals of one or more devices in the CCR and to the gate terminals of one or more devices that do not belong to the CCR. This example assumes that node 256 is the only output node of CCR 250.

Processor 14 converts list 266 into a bipartite graph stored in memory and containing a device vertex for each device 252 in CCR 250 and a node vertex for each node 254 in CCR 250 (step 202). The edges of the graph correspond to the interconnection between nodes and devices. During graph generation, processor 14 labels each vertex with an integer coloring value ("COLOR").

Next, processor 14 labels the input nodes 257 and output node 256 of CCR 250 with an integer coloring value ("CCR_Node_Color") 258 (step 204). Processor 14 uses CCR_Node_Color 258 to distinguish the nodes that interconnect CCRs while running CCR-netlist-compare procedure 42 (FIG. 2).

Processor 14 then assigns an initial value to COLOR for each device vertex (step 206). Processor 14 bases the initial COLOR of each device vertex on the device type 260 (P, N, etc.) and device size 262. The device size 262 is an integer value based on resistance ratios within CCR 250, and is generated by the well-known SIM2NTK strength analysis algorithm in COSMOS.

Next, processor 14 assigns an initial value to COLOR for each node vertex (step 208). Processor 14 uses predefined values for the COLOR of the power and ground nodes. Processor 14 bases the initial COLOR of the other nodes on their capacitive strengths. Capacitive strength is an approximation of the capacitance 280 of a node.

Coloring procedure 200 uses resistance ratios and capacitive strengths instead of actual device sizes and actual capacitances to improve the accuracy of the results of CCR-netlist-compare procedure 42. If actual device sizes and actual capacitances were used, small differences in device size or node capacitance would not cause coloring procedure 200 to incorrectly label CCR 250 as non-unique. However, these differences could cause CCR-netlist-compare procedure 42 to incorrectly designate a CCR from CCR schematic netlist 34 as being different from a corresponding CCR in CCR network netlist 40. CCR-netlist-compare procedure 42 uses the CCR signatures generated by coloring procedure 200 to determine whether CCRs from schematic 10 and layout 12 match. Because the initial coloring of the device vertices and the node vertices affects the final signatures that are generated for the CCRs, trivial differences in device sizes or node capacitances could cause a mismatch between the CCRs. By equating all device sizes and node capacitances that fall within a given range, rather than using exact sizes or capacitances, coloring procedure 200 prevents CCR-netlist-compare procedure 42 from generating incorrect error messages in response to trivial differences. The sensitivity of the resistance ratios and capacitive strengths is changed from an external datafile (FIG. 2, 33).

After initializing the COLORs of the node vertices and device vertices in CCR 250, processor 14 determines whether the COLORs of all of the node vertices and device vertices in CCR 250 are distinguishable (step 210). If so, processor 14 designates CCR 250 as unique and ends coloring procedure 200 (step 224).

If CCR 250 is not unique, processor 14 recolors any node vertices having indistinguishable COLORs by assigning new values to the COLOR of those node vertices (step 212). In recoloring the node vertices, processor 14 relies on vertex invariants. Vertex invariants are properties of a vertex that are consistent between isomorphic graphs. Isomorphic graphs are graphs having the same interconnectivity between their vertices. Thus, the vertex invariants of a group of devices that are interconnected in a particular manner will be identical no matter how the group of devices is actually implemented. In coloring procedure 200, the vertex invariants of the node vertices are the COLORs of the device vertices to which the node vertices are connected via the devices' source/drain terminals. Thus, processor 14 recolors indistinguishable node vertices by modifying the COLORs of such node vertices based on the COLORs of the device vertices to which they connect. For example, processor 14 multiplies the COLOR of an indistinguishable node vertex by the COLORs of all of the device vertices to which the indistinguishable node vertex connects via a source/drain terminal.

After recoloring any indistinguishable node vertices, processor 14 determines whether CCR 250 has become unique (step 214). If so, processor 14 designates CCR 250 as such and ends coloring procedure 200 (step 224).

If CCR 250 still remains non-unique, processor 14 recolors any device vertices having indistinguishable COLORs (step 216). In recoloring the device vertices, processor 14 also relies on vertex invariants. The vertex invariants of a device vertex are the COLORs of the node vertices to which the device vertex is connected via source/drain terminals. Thus, processor 14 recolors indistinguishable device vertices by modifying the COLORs of such device vertices based on the COLORs of the node vertices to which the indistinguishable device vertices connect via a source/drain terminal. For example, processor 14 multiplies the COLOR of an indistinguishable device vertex by the COLORs of all of the node vertices to which the indistinguishable device vertex connects via a source/drain terminal.

After recoloring any indistinguishable device vertices, processor 14 determines whether steps 212 or 216 have produced any changes in the COLORs of node vertices or device vertices in CCR 250 (step 218). If any of the COLORs have changed, processor 14 determines whether CCR 250 is unique (step 220). If so, processor 14 designates CCR 250 as such and ends coloring procedure 200 (step 224). If processor 14 determines that CCR 250 is still non-unique (step 220), processor 14 performs another iteration of steps 212–220. The repetition of steps 212–220 is known as iterative refinement.

If processor 14 determines that steps 212 and 216 have produced no changes in the COLOR of any node vertex or device vertex in CCR 250 (step 218), then coloring procedure 200 cannot uniquely identify all node vertices and device vertices in CCR 250 through iterative refinement. In iterative refinement, changes in one repetition of a process are a necessary condition for changes in later repetitions. Thus, when an iteration of the process produces no changes, no later iteration will be able to produce a change.

If processor 14 determines that coloring procedure 200 cannot distinguish all nodes 252 and devices 254 in CCR 250 through iterative refinement, processor 14 applies an OR heuristic (step 222) in a final attempt to distinguish all nodes 252 and devices 254 in CCR 250. The motivation for applying the OR heuristic is that, as discussed above, the efficiency of CCR-netlist-generate procedure 32 is directly related to the number of unique CCRs. Thus, if application of the OR heuristic designates as unique a CCR that otherwise would be designated as non-unique, by distinguishing all node vertices and device vertices contained therein, the efficiency of CCR-netlist-generate procedure 32 is increased.

In some cases, devices are indistinguishable because the devices are automorphic. Devices are automorphic when switching connections to the gate terminals of the devices has no effect on the logical or timing behavior of the devices. For example, devices 62 and 64 in FIG. 1 are automorphic. The signal produced at node N1 will be the same regardless of whether node B is connected to device 62 and node C is connected to device 64 or node C is connected to device 62 and node B is connected to device 64.

The OR heuristic (step 222) reduces the number of non-unique CCRs resulting from such automorphic devices. In operation, when processor 14 determines that iterative refinement was unsuccessful, processor 14 examines the indistinguishable devices. If processor 14 determines that all indistinguishable devices belong to a single parallel source/drain group (e.g., devices 62, 64), processor 14 declares the devices to comprise an OR gate. In this case, processor 14 also declares the CCR to be unique and ends coloring procedure 200 (step 224). If processor 14 determines that some indistinguishable devices do not belong to a single parallel source/drain group, processor 14 ends coloring procedure 200 (step 224) without declaring the CCR to be unique.

In other cases, devices are indistinguishable due to a lack of contextual information. These devices are not automorphic. Rather, they are indistinguishable because coloring procedure 200 does not look beyond the boundaries of the particular CCR that coloring procedure 200 is examining. CCR-netlist-compare procedure 42 eventually distinguishes devices that cannot be distinguished by coloring procedure 200 due to lack of contextual information. This is because, as discussed below, CCR-netlist-compare procedure 42 looks beyond the boundaries of any particular CCR.

HCNC program 24 uses inverter folding procedure 28 to reduce the effects of a lack of contextual information on the ability of CCR-netlist-generate procedure 32 to uniquely identify CCRs. As discussed, CCR-netlist-compare procedure 42 compensates for the lack of contextual information in CCR-netlist-generate procedure 32, and therefore inverter folding 28 is not essential for successful operation of HCNC program 24. However, inverter folding 28 reduces the number of non-unique CCRs and thereby improves the efficiency of CCR-netlist-generate procedure 32.

Figure 8:
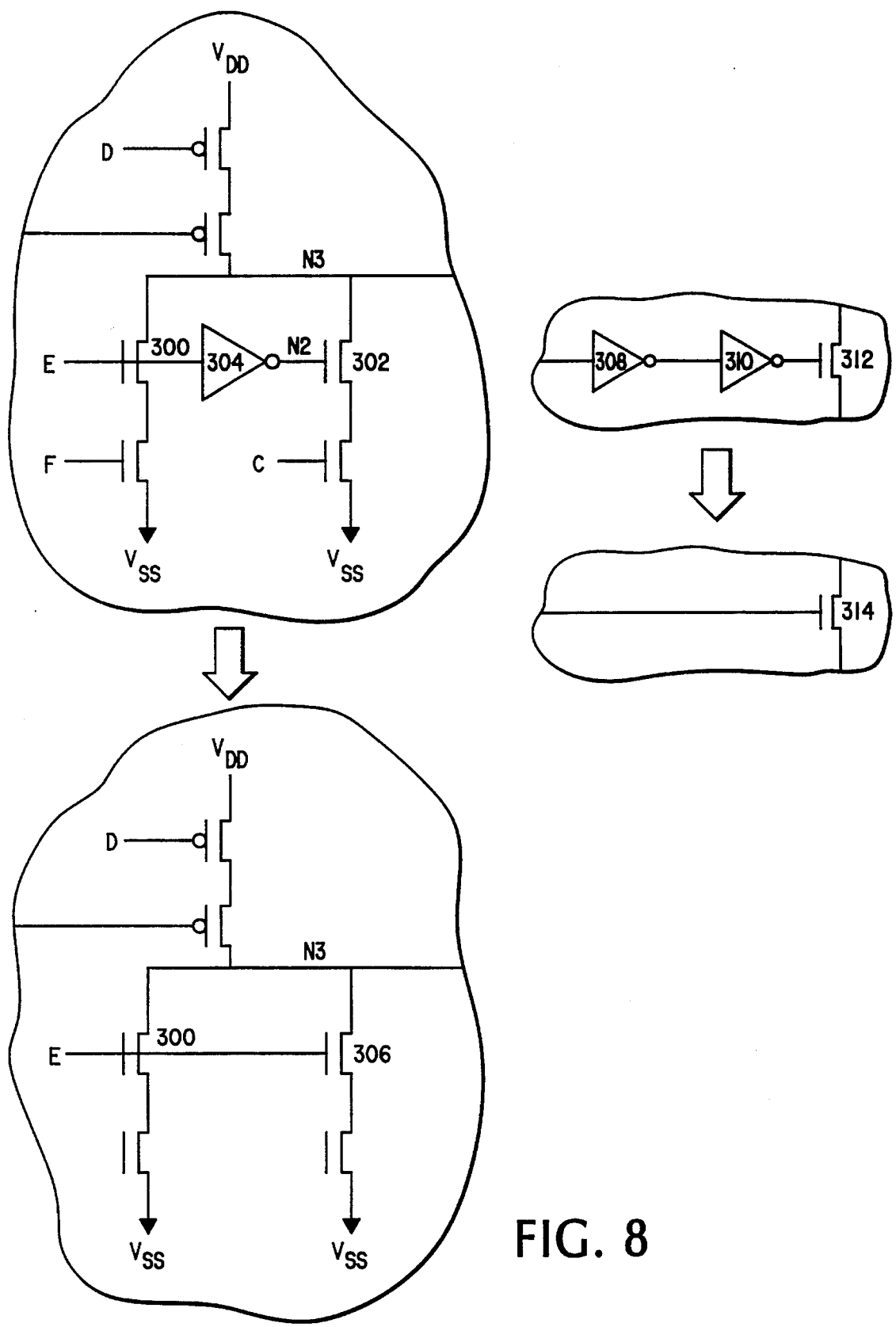
FIG. 8 illustrates inverter folding by the system of FIG. 2.

Referring also to FIG. 8, inverter folding procedure 28 reduces the overall number of CCRs as well as the number of non-unique CCRs by eliminating all inverters from netlist 36 (FIG. 2). Because each inverter is a CCR, elimination of inverters necessarily reduces the number of CCRs. Though inverter folding 28 eliminates inverters, inverter folding 28 retains the logical and electrical effects of the inverters. The logical effect of an inverter is retained by changing the polarity of the gates to which the inverter is connected. Thus, for example, when eliminating inverter 304, processor 14 replaces N-device 302 with P-device 306. The electrical effect of an inverter is retained by modifying the size of the gates to which the inverter connects based on the size of the inverter. Thus, P-device 306 is a larger device than N-device 302.

Inverter folding 28 reduces the number of non-unique CCRs by adding contextual information to CCRs that have gate connections to inverters. For example, prior to inverter folding, N-device 300 and N-device 302 are indistinguishable. After inverter folding 28, N-device 300 differs in device type from P-device 306 (which replaced N-device 302) and is therefore readily distinguishable.

Multiple inverters can be folded into the same devices. To maintain information about the effects of multiple inverters, processor 14 maintains iteration counts of the number of inverters folded at all affected devices. This eliminates a problem that could arise, for example, from the fact that three small inverters in series can have the same logical and electrical effect of a single large inverter. In that case, if no iteration count were maintained, important information could be lost in the inverter folding process. Thus, for example, when inverter 308 and inverter 310 are folded into N-device 312, the resulting N-device 314 is substantially larger than N-device 312 and includes an iteration count of "2".

As illustrated by the example in FIG. 7, CCR-netlist-generate procedure 32 produces as an output a CCR netlist 264 that is substantially smaller than a netlist 266 used as an input. Netlist 266 includes a list of devices 252 and a list of nodes 254. For each device 252, netlist 266 also includes information about the device's type 260, size 262, gate node 268 (the node connected to the gate terminal of the device), source node 270 (the node connected to the source terminal of the device), and drain node 272 (the node connected to the drain terminal of the device). Netlist 266 also includes information about the capacitance 280 of each node 254.

By contrast, CCR netlist 264 includes a list of CCRs 250 and a list of nodes 256. Because all CCRs 250 include two or more devices 252, the number of CCRs 250 in CCR netlist 264 is less than the number of devices in netlist 266. In this example, CCR netlist 264 includes a single CCR. In addition to there being less CCRs than devices, a particular CCR 250 is defined by substantially less information than is necessary to define the devices 252 contained within the CCR 250. For example, information about the device type 260, device size 262, source node 270, and drain node 272 for all devices 252 within a CCR 250 is consolidated into the signature of CCR 250, a single integer designated as COLOR 274. Information about the gate nodes 268 of the devices 252 is retained as a list of input nodes 276 in the CCR. When two or more devices 252 share common gate nodes 268, the number of input nodes 276 is less than the number of devices 252 in the CCR 250.

In addition to reducing the size of the list of devices 252, CCR-netlist-generate procedure 32 reduces the size of the list of nodes 254. Typically, a CCR 250 has a single output node 278. Thus, the list of nodes 254 and capacitances 280 in netlist 266 for a CCR 250 are typically replaced by a single node 256 in CCR netlist 264. Node 256 is described by a single integer, CCR_node_color 258.

Figure 9:
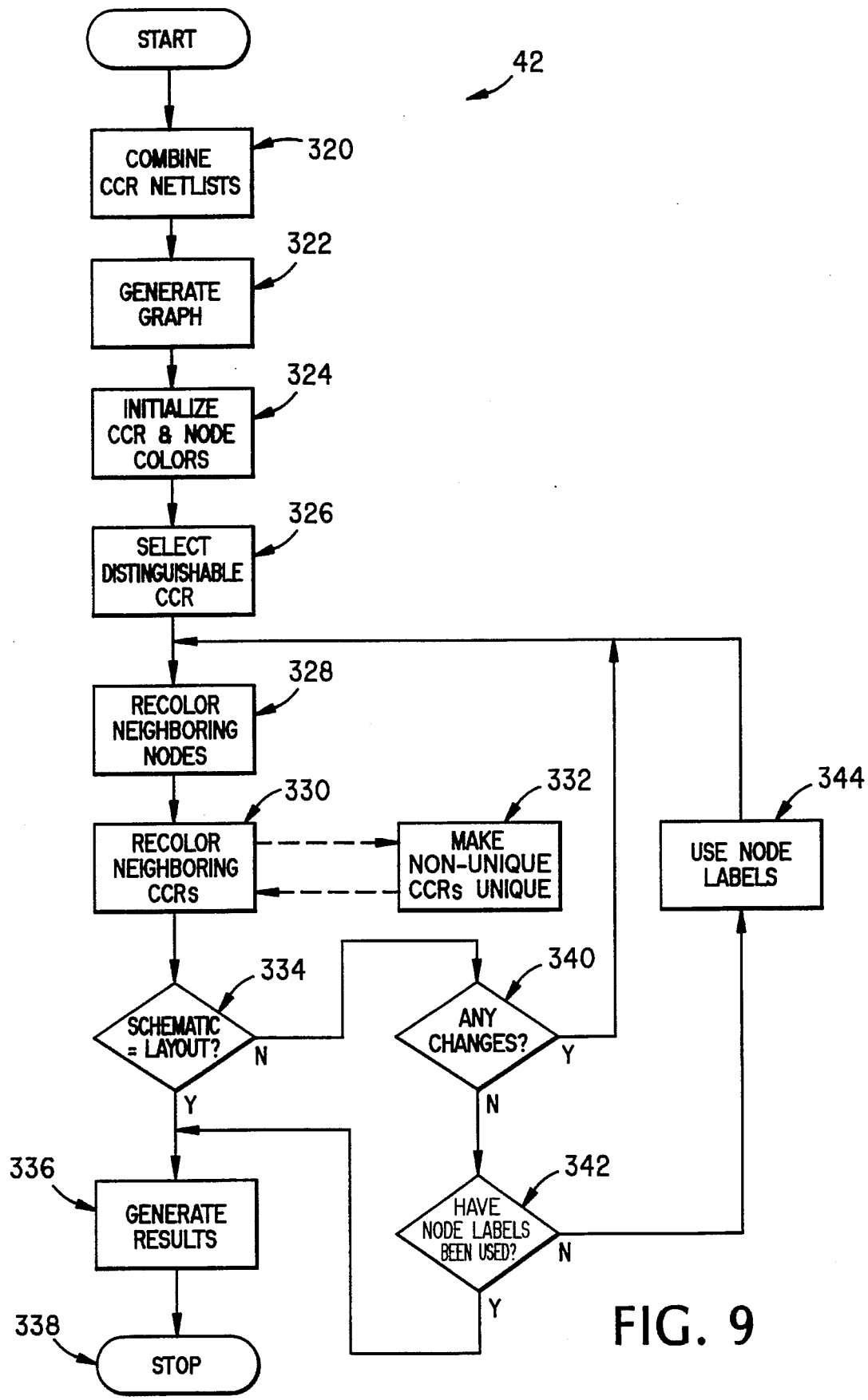
FIG. 9 is a block diagram of a procedure used to compare netlists by the system of FIG. 2.

Referring to FIG. 9, CCR-netlist-compare procedure 42, like coloring procedure 200, uses vertex invariants and iterative refinement to compare CCR schematic netlist 34 and CCR network netlist 40. Here, CCR-netlist-compare procedure 42 recolors CCRs based on the colors of the nodes to which they connect and recolors nodes based on the colors of the CCRs to which they connect. However, unlike coloring procedure 200, CCR-netlist compare procedure 42 does not recolor all indistinguishable nodes and CCRs during each iteration. Instead, CCR-netlist-compare procedure 42 recolors only those indistinguishable nodes or CCRs that are adjacent to CCRs or nodes that were recolored during the previous iteration.

Initially, processor 14 combines CCR schematic netlist 34 and CCR network netlist 40 into a combined netlist (step 320), and designates the origin of each CCR and node in the combined netlist so that, for example, nodes of CCR schematic netlist 34 are identifiable as such. Processor 14 then generates a bipartite graph containing a CCR vertex for each CCR in the combined netlist and a node vertex for each node in the combined netlist (step 322). Next, processor 14 initializes the colors of the CCRs and the nodes (step 324). The initial color for a node is the CCR_NODE_COLOR produced by processor 14 in coloring procedure 200. The initial color for a CCR is the CCR signature produced by processor 14 in coloring procedure 200.

To begin iterating, processor 14 selects all distinguishable CCRs that appears only once in each of the CCR netlists 34, 40 (step 326). To do this, processor 14 finds all CCR signatures that appears twice in the combined netlist, with one version originating from the CCR schematic netlist 34 and one version originating from the CCR network netlist 40. For example, if the circuit includes a single ring shifter, and the ring shifter is implemented correctly in both the CCR schematic netlists 34 and the CCR network netlist 40, then processor 14 would select the CCR representing the ring shifter as a distinguishable CCR.

After selecting a CCR, processor 14 recolors any indistinguishable nodes that are connected to the selected CCRs (step 328). Thus, in this step, processor 14 recolors any indistinguishable input nodes or output nodes of the selected CCRs based on the colors of the CCRs to which those nodes connects. For example, processor 14 multiplies the color of a node by the colors of all of the CCRs to which that node connects.

After recoloring the nodes (step 328), processor 14 recolors any indistinguishable CCRs that are connected to one or more nodes that were recolored in step 328 (step 330). Processor 14 recolors the CCRs based on the colors of the nodes to which that CCR connects. For example, processor 14 multiplies the color of the CCR by the colors of all of the nodes to which that CCR connects. If a CCR to be recolored is a non-unique CCR, processor 14 attempts to make the CCR unique by recoloring the CCR's internal nodes and devices based on the new colors of the nodes that are external to the CCR (step 332). If the recoloring from step 332 makes the CCR unique, processor 14 replaces the nodes and devices defining the CCR with a CCR signature.

Next, processor 14 determines if transistor level schematic 10 and layout 12 are consistent (step 334). If so, processor 14 generates a result (step 336). In this case, processor 14 generates signal 44 to indicate that transistor level schematic 10 and layout 12 are consistent. Thereafter, processor 14 stops CCR-netlist compare procedure 42 (step 338).

If processor 14 determines that transistor level schematic 10 and layout 12 are not consistent or that processor 14 does not have enough information to make that determination (step 334), processor 14 determines if the most recent iteration of the recoloring stops has changed the colors of any CCRs or devices (step 340). If so, processes 14 performs another iteration by proceeding to step 328 and recoloring any indistinguishable nodes that are connected to one or more CCRs that were recolored in the previous step 330.

If there were no changes to the colors, and processor 14 has not used node labels in recoloring (step 342), processor 14 begins using node labels in recoloring (step 344). Thereafter, processor 14 performs another iteration by proceeding to step 328.

If there were no changes to the colors, and processes 14 has already used node labels in recoloring, processor 14 generates a result (step 336). In this case, processor 14 generates error list 46 to indicate the differences between transistor level schematic 10 and layout 12.

Other embodiments are within the following claims.

What is claimed is:

1. A method for determining whether multiple representations of a design of a circuit are consistent with each other, said circuit including a plurality of devices each of which has a channel for conducting electrical current and a plurality of nodes interconnecting said devices, each one of said representations including a list of device elements that describe said devices and a list of node elements that describe said nodes, said method including modifying a of said lists in a first one of the multiple representations by:
analyzing said device elements and said node elements in said first one of the multiple representations to identify at least one channel connected region of said circuit, said channel connected region including a subset of said devices the channels of which are interconnected by a subset of said nodes,
defining, for each said channel connected region, a channel connected region element that describes said subset of said devices and said subset of said nodes in said region, and
replacing the device elements of each said subset of devices and the node elements of each said subset of nodes in said first list with said channel connected region element;

modifying said lists in a second one of the multiple representations by:
analyzing said device elements and said node elements in said second one of the multiple representations to identify at least one channel connected region of said circuit, said channel connected region including a subset of said devices the channels of which are interconnected by a subset of said nodes,
defining, for each said channel connected region, a channel connected region element that describes each said subset of said devices and each said subset of said nodes in said region, and
replacing the device elements of said subset of devices and the node elements of said subset of nodes in said second list with said channel connected region element; and comparing the modified lists in said first one of the multiple representations with the modified lists in said second one of the multiple representations as a basis for determining whether said representations are consistent with each other.

2. The method of claim 1 wherein said step of modifying said lists in said first one of the multiple representations includes repeating said steps of analyzing, defining, and replacing at least until every one of said devices and said nodes has been analyzed.

3. The method of claim 2 wherein said step of modifying said lists in said first one of the multiple representations includes repeating said steps of analyzing, defining, and replacing at least until every one of said devices and nodes has been analyzed.

4. The method of claim 1 wherein said lists in said first one of the multiple representations represents a schematic diagram of said circuit, and said lists in said second one of the multiple representations represents a physical layout of said circuit.

5. The method of claim 1 wherein said modifying step for each one of said lists includes determining whether said devices in said subset are distinguishable from each other and whether said nodes in said subset are distinguishable from each other, describing devices in said subset that are distinguishable from each other and nodes in said subset that are distinguishable from each other in said channel connected region element and removing the device elements that describe said devices and the node elements that describe said nodes from said one list, retaining in said one list the device elements that are determined to be not distinguishable from each other and the node elements that are determined to be not distinguishable from each other, and retaining in said one list the node elements that interconnect said channel connected region to another channel connected region or to another one of said devices of said circuit.

6. The method of claim 5 further comprising preassigning to each one of said node elements a value that corresponds to at least one electrical characteristic of the node described thereby, and comparing the values of said nodes in said subset to determine whether said nodes are distinguishable from each other.

7. The method of claim 6 further comprising preassigning to each one of said device elements a value that corresponds to an electrical characteristic of the device described thereby, for nodes that are determined to be not distinguishable from each other, revising the values of the node elements that describe said nodes based on the values of the device elements that describe the devices connected to said nodes, and thereafter comparing the revised values of said node elements to determine whether said nodes are distinguishable from each other and, if said nodes are determined to be distinguishable from each other, describing said devices and said nodes in said channel connected region element and removing the device elements that describe said devices and the node elements that describe said nodes from said one list.

8. The method of claim 5 further comprising preassigning to each one of said device elements a value that corresponds to at least one electrical characteristic of the device described thereby, and comparing the values of said devices in said subset to determine whether said devices are distinguishable from each other.

9. The method of claim 8 further comprising preassigning to each one of said node elements a value that corresponds to an electrical characteristic of the node described thereby, for devices that are determined to be not distinguishable from each other, revising the values of the device elements that describe said devices based on the values of the node elements that describe the nodes connected to said devices, and thereafter comparing the revised values of said device elements to determine whether said devices are distinguishable from each other and, if said devices are determined to be distinguishable from each other, describing said devices and said nodes in said channel connected region element and removing the device elements that describe said devices and the node elements that describe said nodes from said one list.

10. The method of claim 9 further comprising repeating said revising and comparing steps until either all of said devices have been determined to be distinguishable from each other or the values of all said device elements have been revised.

11. The method of claim 10 further comprising, after the values of all said device elements have been revised, determining whether at least some of the devices that have been determined to be not distinguishable from each other have channels that are connected in parallel and, if so, describing said devices and the nodes to which said devices are connected in said channel connected region element, and removing the device elements that describe said devices and the node elements that describe said nodes from said one list.

12. The method of claim 6 or 9 wherein said at least one electrical characteristic of said node includes a capacitance at said node.

13. The method of claim 7 or 8 wherein said at least one electrical characteristic of said device includes a size and a conductive type of said device.

14. The method of claim 1 further comprising, when said circuit includes nodes and devices arranged to define inverters, prior to modifying the lists in said first one of the multiple representations, removing from said lists in said first one of the multiple representations the node elements and device elements that represent the nodes and devices arranged to define inverters and modifying the node elements and device elements that represent the nodes and devices connected to said inverters to account for the electrical and logical effects of said inverters.

15. The method of claim 1 wherein said method further includes preassigning to each one of said node elements in said lists in said first one of the multiple representations a value that corresponds to at least one characteristic of the node described thereby, preassigning to each one of said channel connected region elements in said lists in said first one of the multiple representations a value that corresponds to at least one characteristic of the channel connected region described thereby, selecting a channel connected region element that appears a predetermined minimum number of times in said lists in said first one of the multiple representations, comparing the values of the node elements representing the nodes connected to the channel connected region represented by the selected channel connected region element to determine whether said nodes are distinguishable from each other, and for nodes that are determined to be not distinguishable from each other, revising the values of the node elements that describe said nodes based on the values of the channel connected region elements that describe the channel connected regions connected to said nodes, and thereafter comparing the revised values of said node elements to determine whether said nodes are distinguishable from each other and, if said nodes are determined to be distinguishable from each other, comparing the values of the node elements from said lists in said first one of the multiple representations to the values of the node elements from said lists in said second one of the multiple representations as a basis for determining whether said representations are consistent with each other.

16. The method of claim 15 wherein said method further includes comparing the values of said channel connected region elements to determine whether said channel connected region elements are distinguishable from each other, and for channel connected regions that are determined to be not distinguishable from each other, revising the values of the channel connected region elements that describe said channel connected regions based on the values of the node elements that describe the nodes connected to said channel connected regions, and thereafter comparing the revised values of said channel connected region elements to determine whether said channel connected regions are distinguishable from each other and, if said channel connected regions are determined to be distinguishable from each other, comparing the values of the channel connected region elements from said first list to the values of the channel connected region elements from said second list as a basis for determining whether said representations are consistent with each other.

17. The method of claim 16 wherein said method further includes comparing the values of the node element representing the nodes connected to channel connected regions represented by channel connected region elements the values of which were previously revised to determine whether said nodes are distinguishable form each other, and for nodes that are determined to be not distinguishable from eact other, revising the values of the node elements that describe said nodes based on the values of the channel connected region elements that describe the channel connected regions connected to said nodes, and thereafter comparing the revised values of said node elements to determine whether said nodes are distinguishable from each other and, of said nodes are determined to be distinguishable from each other, comparing the values of the node elements from said first list to the values of the node elements from said second list as a basis for determining whether said represen- tations are consistent with each other.

* * * * *

UNITED STATES PATENT AND TRADEMARK OFFICE
CERTIFICATE OF CORRECTION

PATENT NO. : 5,463,561

DATED : October 31, 1995

INVENTOR(S) : Rahul Razdan

It is certified that error appears in the above-identified patent and that said Letters Patent is hereby corrected as shown below:

Col. 10, line 22, "OR" should be --OR--.

Col. 13, claim 1, line 43, after modifying, delete "a" and "of".

Col. 16, claim 17, line 60, "eact" should be --each--.

Signed and Sealed this

Eighth Day of July, 1997

Attest:

BRUCE LEHMAN

*Attesting Officer*          *Commissioner of Patents and Trademarks*